(12) United States Patent
Ito et al.

(10) Patent No.: US 8,796,779 B2
(45) Date of Patent: Aug. 5, 2014

(54) SEMICONDUCTOR DEVICE

(71) Applicant: Panasonic Corporation, Osaka (JP)

(72) Inventors: Satoru Ito, Hyogo (JP); Yoshiya Moriyama, Toyama (JP); Hiroshi Ohkawa, Toyama (JP); Susumu Akamatsu, Toyama (JP)

(73) Assignee: Panasonic Corporation, Osaka (JP)

( * ) Notice: Subject to any disclaimer, the term of this patent is extended or adjusted under 35 U.S.C. 154(b) by 68 days.

(21) Appl. No.: 13/665,305

(22) Filed: Oct. 31, 2012

(65) Prior Publication Data

US 2013/0056831 A1     Mar. 7, 2013

Related U.S. Application Data

(63) Continuation of application No. PCT/JP2011/002868, filed on May 24, 2011.

(30) Foreign Application Priority Data

Sep. 14, 2010   (JP) .................................. 2010-205599

(51) Int. Cl.
  *H01L 27/088*     (2006.01)
(52) U.S. Cl.
  USPC ........................................................ 257/368
(58) Field of Classification Search
  USPC .................. 257/632, 635, E21.409, E21.645, 257/E29.001, 18–20, 55, 63–70, 178, 192, 257/213, 272–274, 368–369, 257/E21.43–E21.434, E21.619, E21.634, 257/E27.059–E27.067, E29.193, E31.049; 438/153–154, 203, 938, 933
  See application file for complete search history.

(56) References Cited

U.S. PATENT DOCUMENTS

| | | | |
|---|---|---|---|
| 5,595,922 A | 1/1997 | Tigelaar et al. | |
| 8,492,230 B2 * | 7/2013 | Ishikawa et al. | ............. 438/283 |
| 2003/0045058 A1 | 3/2003 | Druijf et al. | |
| 2004/0032001 A1 | 2/2004 | Gilmer et al. | |
| 2004/0082130 A1 | 4/2004 | Suzuki et al. | |
| 2009/0294924 A1 * | 12/2009 | Forbes et al. | ................ 257/635 |
| 2010/0164007 A1 | 7/2010 | Onishi et al. | |
| 2010/0176456 A1 | 7/2010 | Ikeno et al. | |

FOREIGN PATENT DOCUMENTS

| | | | |
|---|---|---|---|
| JP | 08-306797 A | | 11/1996 |
| JP | 2003100896 | * | 9/2001 |
| JP | 2003-100896 A | | 4/2003 |
| JP | 2003-100896 A | | 4/2003 |

(Continued)

OTHER PUBLICATIONS

T. Schram et al., "Novel Process to Pattern Selectively Dual Dielectric Capping Layers Using Soft-Mask Only", Symposium on VLSI Technology Digest of Technical Papers, pp. 44-45 (2008).

(Continued)

*Primary Examiner* — Fernando L Toledo
*Assistant Examiner* — Lawrence-Linh T Nguyen
(74) *Attorney, Agent, or Firm* — McDermott Will & Emery LLP

(57) ABSTRACT

A first MIS transistor and a second MIS transistor of the same conductivity type are formed on an identical semiconductor substrate. An interface layer included in a gate insulating film of the first MIS transistor has a thickness larger than that of an interface layer included in a gate insulating film of the second MIS transistor.

15 Claims, 13 Drawing Sheets

(56) References Cited

FOREIGN PATENT DOCUMENTS

| JP | 2004-79606 A | 3/2004 |
| JP | 2004-079606 A | 3/2004 |
| JP | 2009-123944 A | 6/2009 |

OTHER PUBLICATIONS

International Search Report mailed Aug. 23, 2011 issued in corresponding International Application No. PCT/JP2011/002868.

* cited by examiner

SEMICONDUCTOR DEVICE

CROSS-REFERENCE TO RELATED APPLICATION

This is a continuation of PCT International Application PCT/JP2011/002868 filed on May 24, 2011, which claims priority to Japanese Patent Application No. 2010-205599 filed on Sep. 14, 2010. The disclosures of these applications including the specifications, the drawings, and the claims are hereby incorporated by reference in their entirety.

BACKGROUND

The present disclosure relates to semiconductor devices and methods for fabricating the same, and more particularly, to a metal insulator semiconductor (MIS) device including a gate insulating film formed on a semiconductor substrate and a gate electrode formed on the gate insulating film, and a method for fabricating the MIS device.

In order to meet the demands for increased speed and reduced power consumption of semiconductor integrated circuit devices, in respect of metal insulator semiconductor field-effect transistors (MISFET, hereinafter referred to as MIS transistors), progress has been made in reducing the thicknesses of gate insulating films. When silicon dioxide which has been conventionally used is formed into a thin film for the purpose of reducing the thickness of a gate insulating film, a gate leakage current caused by a tunnel current increases. Consequently, an attempt to prevent depletion of a gate electrode has been made. Specifically, the attempt has been carried out by reducing an equivalent oxide thickness (EOT) by means of use of, instead of the silicon dioxide film, a so-called high dielectric constant insulating film such as an $HfO_2$ film as the gate insulating film, and by employing a so-called metal inserted poly silicon (MIPS) structure in which a polysilicon film serving as a gate electrode and a gate insulating film sandwich a metal-containing film as part of the gate electrode (see, for example, T. Schram, et al., Novel Process To Pattern Selectively Dual Dielectric Capping Layers Using Soft-Mask Only, Symp. On VLSI technology, 44 (2008)). Note that the high dielectric constant insulating film refers to an insulating film having a relative dielectric constant of, for example, 8 or more, which is higher than that of a silicon nitride film.

A method for fabricating a conventional semiconductor device will be described below with reference to FIGS. 11-13. This conventional semiconductor device includes a complementary metal insulator semiconductor (CMIS) device composed of an n-type MIS transistor and a p-type MIS transistor which are provided on an identical substrate. In this device, a gate insulating film is made of an $HfO_2$ film, and a gate electrode has a MIPS structure. FIGS. 11-13 are cross-sectional views (taken along a gate length direction) illustrating sequential steps of the method for fabricating the conventional semiconductor device. In FIGS. 11-13, "nMIS transistor region" shown at the left refers to a region where the n-type MIS transistor is formed, and "pMIS transistor region" shown at the right refers to a region where the p-type MIS transistor is formed.

First, as shown in FIG. 11, a pMIS transistor region and an nMIS transistor region are defined by selectively forming a shallow trench isolation 101 in an upper portion of a semiconductor substrate 100 of p-type silicon. Here, a portion of the semiconductor substrate 100 surrounded by the shallow trench isolation 101 and located in the pMIS transistor region serves as an active region 100a, and a portion of the semiconductor substrate 100 surrounded by the shallow trench isolation 101 and located in the nMIS transistor region serves as an active region 100b.

Next, an n-type well region 121N is formed in the pMIS transistor region of the semiconductor substrate 100, and a p-type well region 121P is formed in the nMIS transistor region of the semiconductor substrate 100. Thereafter, photolithography and dry etching are performed to form a gate electrode 123a on the active region 100a in the pMIS transistor region with a gate insulating film 122a interposed between the gate electrode 123a and the active region 100a. The photolithography and the dry etching also form a gate electrode 123b on the active region 100b in the nMIS transistor region with a gate insulating film 122b interposed between the gate electrode 123b and the active region 100b.

The gate insulating film 122a includes an interface layer 102a made of a silicon dioxide film, a high dielectric constant insulating film (hereinafter, referred to as a high-k film) 103a formed on the interface layer 102a and made of an $HfO_2$ film, and a pMIS cap film 104a formed on the high-k film 103a. The gate insulating film 122b includes an interface layer 102b made of a silicon dioxide film, a high-k film 103b formed on the interface layer 102b and made of an $HfO_2$ film, and an nMIS cap film 104b formed on the high-k film 103b. The pMIS cap film 104a and the nMIS cap film 104b enable control of a work function of each of the gate electrodes 123a and 123b.

The gate electrode 123a includes a metal film 106a and a polysilicon film 107a formed on the metal film 106a. The gate electrode 123b includes a metal film 106b and a polysilicon film 107b formed on the metal film 106b.

Next, as shown in FIG. 12, extension regions 108a are formed at both sides of the gate electrode 123a by introducing a p-type impurity into the pMIS transistor region of the semiconductor substrate 100, and extension regions 108b are formed at both sides of the gate electrode 123b by introducing an n-type impurity into the nMIS transistor region of the semiconductor substrate 100.

After a silicon dioxide film and a silicon nitride film are sequentially deposited on the entire surface of the semiconductor substrate 100, the deposited silicon nitride film and the deposited silicon dioxide film are subjected to anisotropic etching. Consequently, as shown in FIG. 13, sidewall spacers 111a including a silicon dioxide film 109a and a silicon nitride film 110a are formed on both side surfaces of the gate electrode 123a, and sidewall spacers 111b including a silicon dioxide film 109b and a silicon nitride film 110b are formed on both side surfaces of the gate electrode 123b. Thereafter, source/drain regions 112a are formed at both sides of the gate electrode 123a sandwiched between the sidewall pacers 111a by introducing a p-type impurity into the pMIS transistor region of the semiconductor substrate 100, and source/drain regions 112b are formed at both sides of the gate electrode 123b sandwiched between the sidewall pacers 111b by introducing an n-type impurity into the nMIS transistor region of the semiconductor substrate 100. In this manner, the CMIS device is formed through the foregoing steps.

SUMMARY

Using the above CMIS device, transistors different in threshold voltage (Vth) can be formed in a semiconductor integrated circuit, and a semiconductor integrated circuit device with improved performance can be produced by employing a low-Vth transistor in a circuit requiring high-speed performance and a high-Vth transistor in a circuit requiring a reduced standby leakage current.

FIG. 14 shows a relationship between an effective work function and a saturation current in transistors. Specifically, in each transistor, an impurity in a transistor channel is adjusted to allow the saturation current to be maximized at each value of the effective work function which is varied. In FIG. 14, the dashed lines indicate the saturation currents of the transistors corresponding to each of two different source off leakage currents.

As shown in FIG. 14, the effective work function value at which a maximum saturation current is obtained in the nMIS transistor is different from the effective work function value at which a maximum saturation current is obtained in the pMIS transistor. FIG. 14 also shows that, even between transistors of the same conductivity type, a difference in the source off leakage current causes the saturation currents to be maximized at different effective work function values.

Note that the "effective work function" is a work function obtained from electrical characteristics of a MIS transistor. Specifically, the effective work function is obtained by incorporating influence such as a level in an insulating film into a work function related to physical properties and representing a difference between a vacuum level and an energy level of a metal. The "saturation current" shown in FIG. 14 corresponds to a driving current per gate width unit, and represents a driving force of each transistor.

Meanwhile, when an effective work function of an nMIS transistor is too low and an effective work function of a pMIS transistor is too high relative to desired source off leakage current and threshold voltage (Vth), a concentration of an impurity in a channel needs to be increased, and accordingly, a saturation current decreases. When an effective work function of an nMIS transistor is too high and an effective work function of a pMIS transistor is too low relative to desired source off leakage current and Vth, an insufficient amount of an impurity for regulating the Vth can be introduced into a channel. In such a case, subthreshold characteristic deteriorates, and accordingly, a saturation current decreases under conditions with a constant source off leakage current.

Accordingly, in a semiconductor integrated circuit device requiring two or more threshold voltages, gate structures having different work functions need to be formed in a single chip in order to maximize a transistor driving force at each threshold voltage.

However, the above-discussed method for fabricating the conventional semiconductor device allows nMIS transistors to have only one work function and pMIS transistors to have only one work function.

It is therefore an object of the present disclosure to enable formation of a plurality of transistors of the same conductivity type having different work functions in a semiconductor device having a MIS structure in which a high-k film is used as a gate insulating film.

To achieve the object, the inventors of the present application studied methods for forming gate structures (a gate structure includes a stack of a gate insulating film and a gate electrode) having different work functions. Specifically, the inventors studied a method in which the thicknesses of an nMIS cap film and pMIS cap film are changed, and a method in which transistors were designed to have metal electrodes of different types. However, these methods were found not to be practical because they consisted of significantly increased number of steps.

As a result of further studies, the inventors have found the following. Thus, gate structures are allowed to have different work functions by increasing the thickness of an interface layer constituting the lowest layer of a gate insulating film by means of selective oxidation which is performed after formation of the gate structures.

Specifically, a semiconductor device of the present disclosure includes a first MIS transistor and a second MIS transistor of an identical conductivity type provided on an identical semiconductor substrate, wherein the first MIS transistor includes a first gate insulating film formed on a first active region in the semiconductor substrate and a first gate electrode formed on the first gate insulating film, the second MIS transistor includes a second gate insulating film formed on a second active region in the semiconductor substrate and a second gate electrode formed on the second gate insulating film, the first gate insulating film includes a first interface layer being in contact with the semiconductor substrate and a first high dielectric constant insulating film formed on the first interface layer, the second gate insulating film includes a second interface layer being in contact with the semiconductor substrate and a second high dielectric constant insulating film formed on the second interface layer, and the first interface layer has a thickness larger than that of the second interface layer.

In the semiconductor device of the present disclosure, the interface layer included in the gate insulating film of the first MIS transistor has a thickness larger than that of the interface layer included in the gate insulating film of the second MIS transistor which is of the same conductivity type as the first MIS transistor. Accordingly, since an EOT of the gate insulating film of the first MIS transistor increases, an effective work function of the first MIS transistor increases. Therefore, according to the present disclosure, a plurality of transistors of an identical conductivity type having different effective work functions can be formed in a semiconductor device having a MIS structure in which a high-k film is used as a gate insulating film.

In the semiconductor device of the present disclosure, the first gate electrode may include first sidewall spacers formed on side surfaces thereof and first insulating spacers interposed between the first gate electrode and the first sidewall spacers, the second gate electrode may include second sidewall spacers formed on side surfaces thereof and second insulating spacers interposed between the second gate electrode and the second sidewall spacers, and the first insulating spacers may be thinner than the second insulating spacers. In this structure, after formation of the gate structures and before formation of the side spacers, the thickness of the interface layer included in the gate insulating film of the first MIS transistor can be increased by performing selective oxidation. In such a case, the first insulating spacers may be offset spacers each having an I-shaped cross section, and the second insulating spacers may be underlying spacers each having an L-shaped cross section. In addition, the first gate electrode may include a first metal-containing film formed on the first high dielectric constant insulating film and a first silicon film formed on the first metal-containing film, the second gate electrode may include a second metal-containing film formed on the second high dielectric constant insulating film and a second silicon film formed on the second metal-containing film, a silicon dioxide film may be interposed between the first silicon film and the first insulating spacers, and the second silicon film may be in contact with the second insulating spacers. Here, a first metal silicide layer may be formed on the first silicon film, and a second metal silicide layer may be formed on the second silicon film. Further, a silicon dioxide film may also be interposed between the first active region and the first sidewall spacers. Furthermore, each of the first insulating spacers and the second insulating spacers may be made of a silicon nitride film.

In the semiconductor device of the present disclosure, the first and second MIS transistors may be pMIS transistors, and the first and second high dielectric constant insulating films may contain aluminum. In such a case, the first gate insulating film may further include a first cap film formed on the first high dielectric constant insulating film and containing aluminum, and the second gate insulating film may further include a second cap film formed on the second high dielectric constant insulating film and containing aluminum.

In the semiconductor device of the present disclosure, the first and second MIS transistors may be nMIS transistors, and the first and second high dielectric constant insulating films may contain lanthanum. In such a case, the first gate insulating film may further include a first cap film formed on the first high dielectric constant insulating film and containing lanthanum, and the second gate insulating film may further include a second cap film formed on the second high dielectric constant insulating film and containing lanthanum. The first and second high dielectric constant insulating films and the first and second cap films may contain, instead of lanthanum, dysprosium (Dy), scandium (Sc), or gadolinium (Gd).

In the semiconductor device of the present disclosure, each of the first and second high dielectric constant insulating films may contain hafnium or zirconium.

In the semiconductor device of the present disclosure, each of the first and second interface layers may be made of a silicon dioxide film.

In the semiconductor device of the present disclosure, the first and second high dielectric constant insulating films may be substantially equal in thickness. The first and second gate electrodes may be made of a substantially identical material. Thus, in the semiconductor device of the present disclosure, the first and second MIS transistors may have a substantially identical gate structure except for the thicknesses of the interface layers.

In the semiconductor device of the present disclosure, an effective work function of the first MIS transistor may be higher than an effective work function of the second MIS transistor.

A method for fabricating the semiconductor device of the present disclosure includes: a step (a) of forming an interface layer, a high dielectric constant insulating film, and a gate electrode material film in a sequential manner on a semiconductor substrate including a first active region and a second active region; a step (b) of patterning the gate electrode material film, the high dielectric constant insulating film, and the interface layer to form a first gate electrode of the gate electrode material film on the first active region with a first gate insulating film including the interface layer and the high dielectric constant insulating film and interposed between the first gate electrode and the first active region, and to form a second gate electrode of the gate electrode material film on the second active region with a second gate insulating film including the interface layer and the high dielectric constant insulating film and interposed between the second gate electrode and the second active region; and the step (c) of increasing the thickness of the interface layer of the first gate insulating film in a selective manner, after the step (b).

According to the method for fabricating the semiconductor device of the present disclosure, the thickness of the interface layer of the first MIS transistor is selectively increased. Consequently, the EOT of the gate insulating film of the first MIS transistor increases, and the effective work function of the first MIS transistor increases. Therefore, a plurality of transistors of an identical conductivity type and different from each other in effective work function can be formed in a semiconductor device having a MIS structure in which a high-k film is used as a gate insulating film.

In the method for fabricating the semiconductor device of the present disclosure, the step (c) may include a step where, after covering the first and second gate electrodes with an insulating film, a portion of the insulating film covering the first gate electrode is selectively etched, and then, the interface layer of the first gate insulating film is selectively oxidized to increase in thickness. This step ensures that the thickness of the interface layer included in the gate insulating film of the first MIS transistor is selectively increased. In such a case, the insulating film covering the first and second gate electrodes may be a silicon nitride film, for example. A heat treatment or a plasma treatment may be performed in an oxygen-containing atmosphere to increase the thickness of the interface layer included in the gate insulating film of the first MIS transistor in a selective manner. In addition, the gate electrode material film may include a metal-containing film formed on the high dielectric constant insulating film and a silicon film formed on the metal-containing film. In the step (c), a silicon dioxide film may be formed to be interposed between the insulating film remaining on the side surfaces of the first gate electrode and the silicon film of the first gate electrode.

The method for fabricating the semiconductor device of the present disclosure may include a step of forming a cap film containing a metal for adjusting a threshold voltage (Vth) on the high dielectric constant insulating film between formation of the high dielectric constant insulating film and formation of the gate electrode material film.

As described above, the present disclosure enables formation of a plurality of transistors of the same conductivity type and different from each other in work function in a semiconductor device having a MIS structure in which a high-k film is used as a gate insulating film. Therefore, the present disclosure is useful as a semiconductor device having a CMIS structure including a plurality of MIS transistors different in threshold voltage (Vth), and for fabricating the semiconductor device.

DETAILED DESCRIPTION

A semiconductor device according to an embodiment of the present disclosure and a method for fabricating the same are described with reference to the drawings.

FIGS. 1-9 are cross-sectional views (taken along a gate length direction) illustrating steps of the method for fabricating a semiconductor device of this embodiment. Note that each of FIGS. 1-9 shows, in the order from right to left, the following regions: "First pMIS transistor region" referring to a region where a first pMIS transistor is to be formed, "Second pMIS transistor region," referring to a region where a second pMIS transistor is to be formed, "First nMIS transistor region" referring to a region where a first nMIS transistor is to be formed, and "Second nMIS transistor region" referring to a region where a second nMIS transistor is to be formed.

In this embodiment, for example, the first pMIS transistor and the second nMIS transistor are used as low-Vth (e.g., 0.1-0.25 V) transistors which are required for high-speed performance, and the second pMIS transistor and the first nMIS transistor are used as high-Vth (e.g., 0.35-0.5 V) transistors which are required for reducing a standby leakage current.

Figure 1:
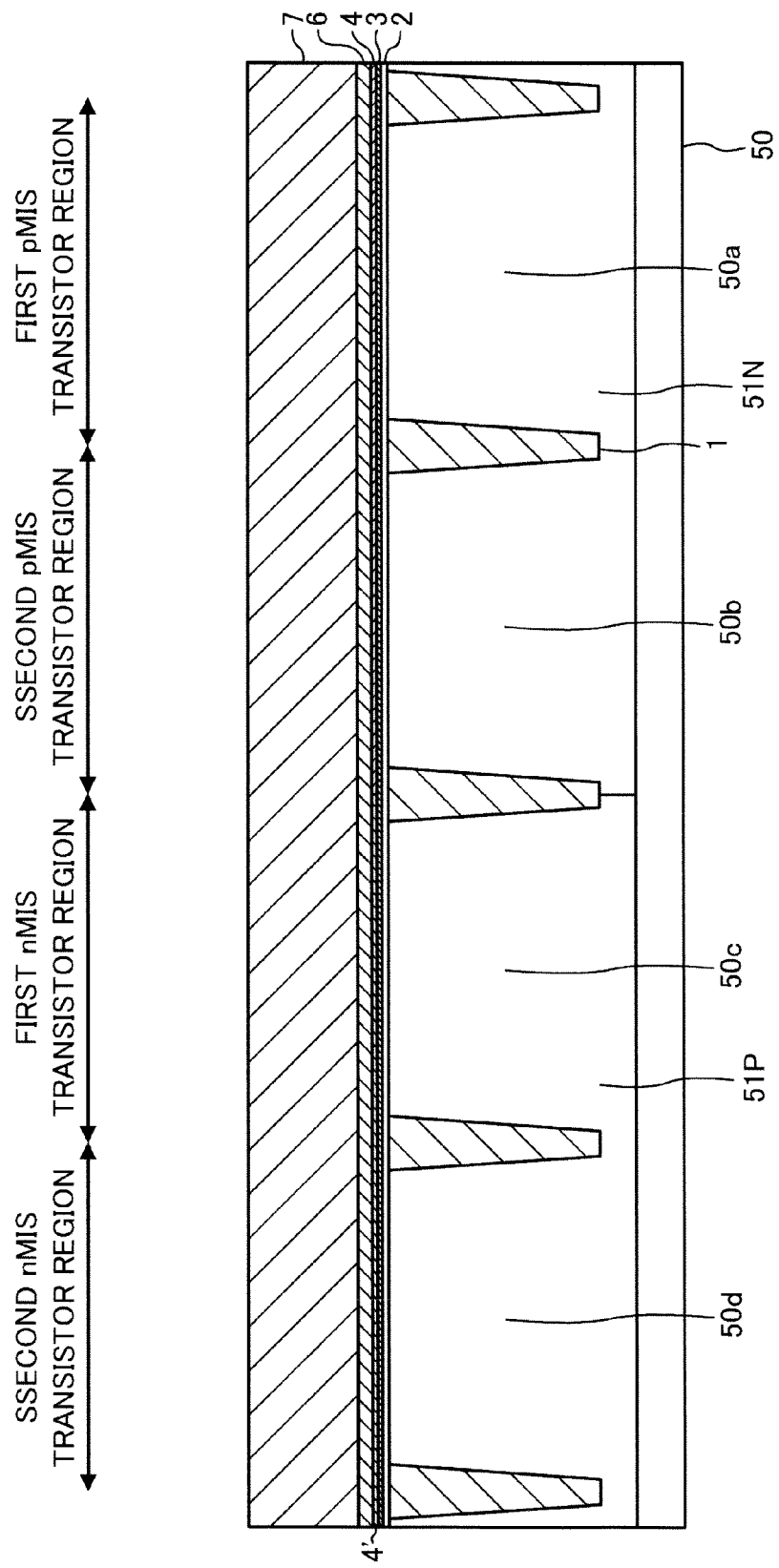
FIG. 1 is a cross-sectional view (taken along a gate length direction) illustrating a step of a method for fabricating a semiconductor device according to an embodiment of the present disclosure.
Figure 2:
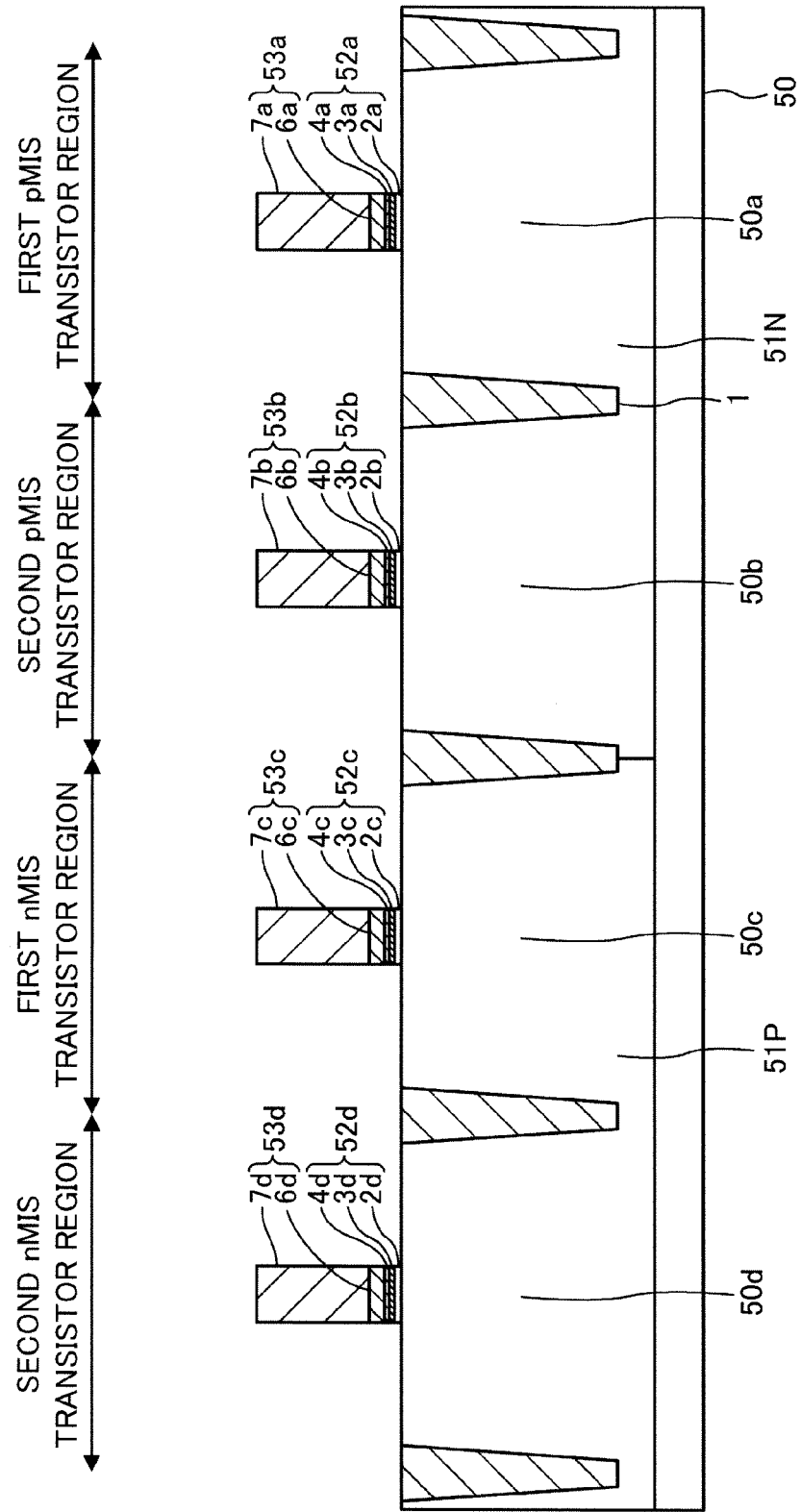
FIG. 2 is a cross-sectional view (taken along a gate length direction) illustrating a step of the method for fabricating the semiconductor device according to the embodiment of the present disclosure.

First, as shown in FIG. 1, pMIS transistor regions and nMIS transistor regions are defined by selectively forming an isolation region 1 made of, for example, a shallow trench filled with a silicon dioxide film in an upper portion of a semiconductor substrate 50 of, for example, p-type silicon. Here, a portion of the semiconductor substrate 50 surrounded by the isolation region 1 and located in the first pMIS transistor region serves as an active region 50a, and a portion of the semiconductor substrate 50 surrounded by the isolation region 1 and located in the second pMIS transistor region serves as an active region 50b. A portion of the semiconductor substrate 50 surrounded by the isolation region 1 and located in the first nMIS transistor region serves as an active region 50c, and a portion of the semiconductor substrate 50 surrounded by the isolation region 1 and located in the second nMIS transistor region serves as an active region 50d.

Next, an n-type well region 51N is formed by introducing an n-type impurity such as arsenic into the first and second pMIS transistor regions of the semiconductor substrate 50 by means of ion implantation. A p-type well region 51P is formed by introducing a p-type impurity such as boron into the first and second nMIS transistor regions of the semiconductor substrate 50 by means of ion implantation. The concentrations of the n-type impurity may be different between the pMIS transistor region and the second pMIS transistor region. The concentration of the p-type impurity may be different between the first nMIS transistor region and the second nMIS transistor region.

Thereafter, an interface layer 2 with a thickness of about 0.8 nm of, for example, a silicon dioxide film and a high dielectric constant insulating film (a high-k film) 3 with a thickness of about 1.2 nm including, for example, Hf or Zr and O are sequentially formed on the semiconductor substrate 50 including the MIS transistor regions.

A pMIS cap film 4 including, for example, aluminum (Al) and oxygen (O) is formed on the high-k film 3, and then, a portion of the pMIS cap film 4 covering the first and second nMIS transistor regions is removed. Subsequently, an nMIS cap film 4' including, for example, lanthanum (La) and O is formed on the high-k film 3 and the pMIS cap film 4, and then, a portion of the nMIS cap film 4' covering the first and second pMIS transistor region is removed. The pMIS cap film 4 includes, for example, Al as a regulator metal capable of increasing effective work functions of the pMIS transistors. The nMIS cap film 4' includes, for example, La as a regulator metal capable of increasing effective work functions of the nMIS transistors.

A metal-containing film 6 with a thickness of about 5 nm including, for example, N and a metal such as Ti, Ta or Ru, and a silicon film 7 with a thickness of about 60 nm of, for example, polysilicon are sequentially formed on the pMIS cap film 4 and the nMIS cap film 4'.

Next, the silicon film 7, the metal-containing film 6, the pMIS cap film 4, the nMIS cap film 4', the high-k film 3, and the interface layer 2 are subjected to photolithography and dry etching to be patterned. The photolithography and dry etching form the structure shown in FIG. 2. Specifically, a gate electrode 53a is formed on the active region 50a in the first pMIS transistor region with a gate insulating film 52a interposed between the gate electrode 53a and the active region 50a. A gate electrode 53b is formed on the active region 50b in the second pMIS transistor region with a gate insulating film 52b interposed between the gate electrode 53b and the active region 50b. A gate electrode 53c is formed on the active region 50c in the first nMIS transistor region with a gate insulating film 52c interposed between the gate electrode 53c and the active region 50c. A gate electrode 53d is formed on the active region 50d in the second nMIS transistor region with a gate insulating film 52d interposed between the gate electrode 53d and the active region 50d.

The gate insulating film 52a includes an interface layer 2a, a high-k film 3a, and a pMIS cap film 4a. The gate insulating film 52b includes an interface layer 2b, a high-k film 3b, and a pMIS cap film 4b. The gate insulating film 52c includes an interface layer 2c, a high-k film 3c, and an nMIS cap film 4c. The gate insulating film 52d includes an interface layer 2d, a high-k film 3d, and an nMIS cap film 4d.

The gate electrode 53a includes a metal-containing film 6a and a silicon film 7a. The gate electrode 53b includes a metal-containing film 6b and a silicon film 7b. The gate electrode 53c includes a metal-containing film 6c and a silicon film 7c. The gate electrode 53d includes a metal-containing film 6d and a silicon film 7d.

Figure 3:
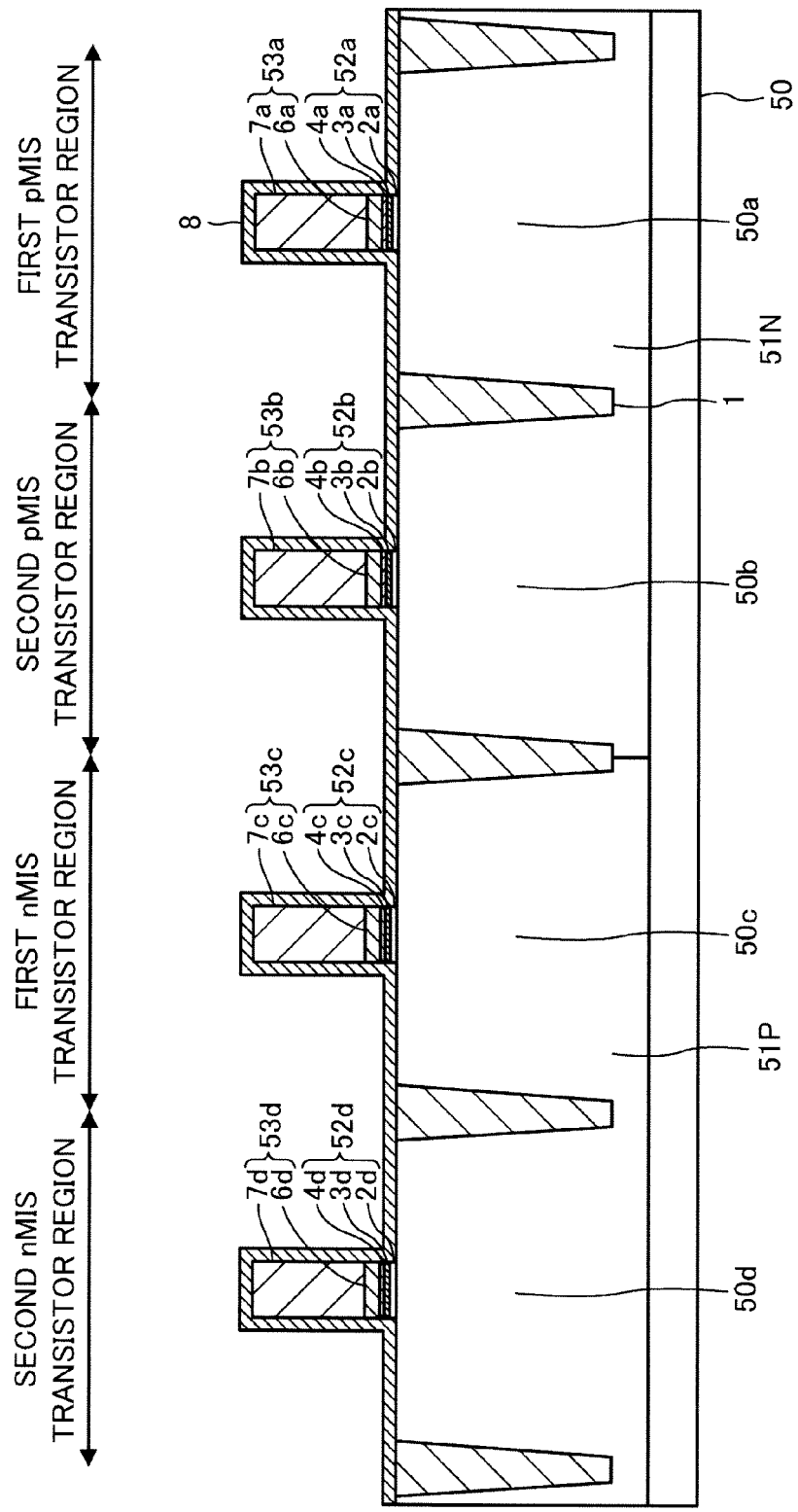
FIG. 3 is a cross-sectional view (taken along a gate length direction) illustrating a step of the method for fabricating the semiconductor device according to the embodiment of the present disclosure.

Next, as shown in FIG. 3, an insulating film 8 with a thickness of about 6 nm of, for example, a silicon nitride film is formed on the entire surface of the semiconductor substrate 50 inclusive of the upper surfaces of the gate electrodes 53a, 53b, 53c and 53d.

Figure 4:
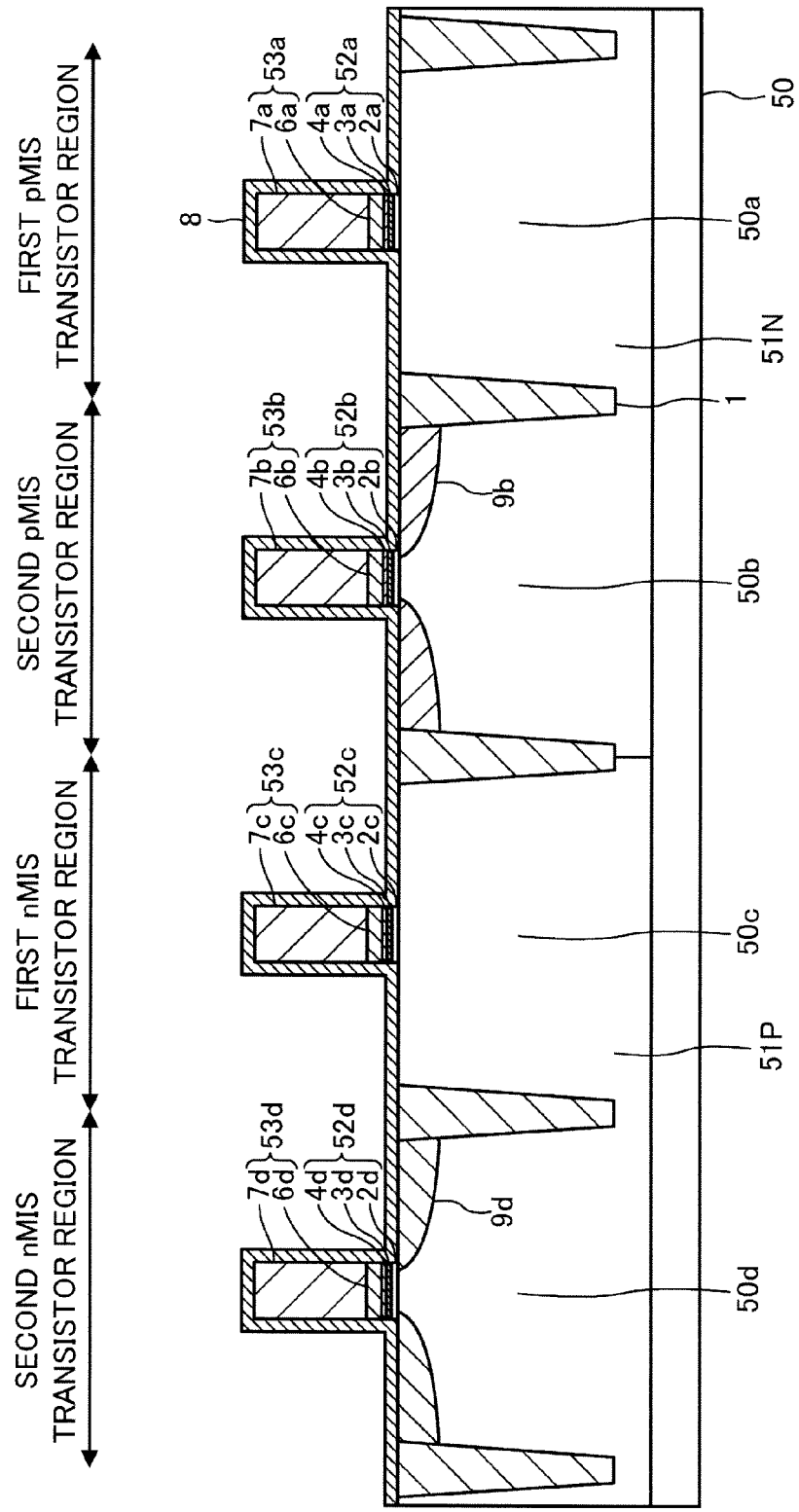
FIG. 4 is a cross-sectional view (taken along a gate length direction) illustrating a step of the method for fabricating the semiconductor device according to the embodiment of the present disclosure.

Using a resist pattern (not shown) which exposes the second pMIS transistor region, a p-type impurity such as boron is introduced into the semiconductor substrate 50 by means of ion implantation. Consequently, as shown in FIG. 4, p-type extension regions 9b are formed under both sides of the gate electrode 53b in the active region 50b. The resist pattern is removed after formation of the p-type extension regions 9b. Here, concerning conditions of the ion implantation, an implantation energy is 0.8 keV and a dose is $1 \times 10^{15}$ cm$^{-2}$, for example. Germanium (Ge) and carbon (C) may be implanted in the second pMIS transistor region of the semiconductor substrate 50 before the ion implantation of the p-type impurity such as boron. In such a case, Ge may be implanted, for example, at an implantation energy of 5 keV and a dose of $5 \times 10^{14}$ cm$^{-2}$, and C may be implanted, for example, at an implantation energy of 2 keV and a dose of $5 \times 10^{14}$ cm$^{-2}$.

Next, using a resist pattern (not shown) which exposes the second nMIS transistor region, an n-type impurity such as arsenic is introduced into the semiconductor substrate 50 by means of ion implantation. Consequently, n-type extension regions 9d are formed under both sides of the gate electrode 53d in the active region 50d. The resist pattern is removed after formation of the n-type extension regions 9d. Here, concerning conditions of the ion implantation, an implantation energy is 1.2 keV and a dose is $1 \times 10^{15}$ cm$^{-2}$, for example. Ge and C may be implanted in the second nMIS transistor region of the semiconductor substrate 50 before the ion implantation of the n-type impurity such as arsenic. In such a case, Ge may be implanted, for example, at an implantation energy of 5 keV and a dose of $5 \times 10^{14}$ cm$^{-2}$, and C may be implanted, for example, at an implantation energy of 2 keV and a dose of $5 \times 10^{14}$ cm$^{-2}$.

Figure 5:
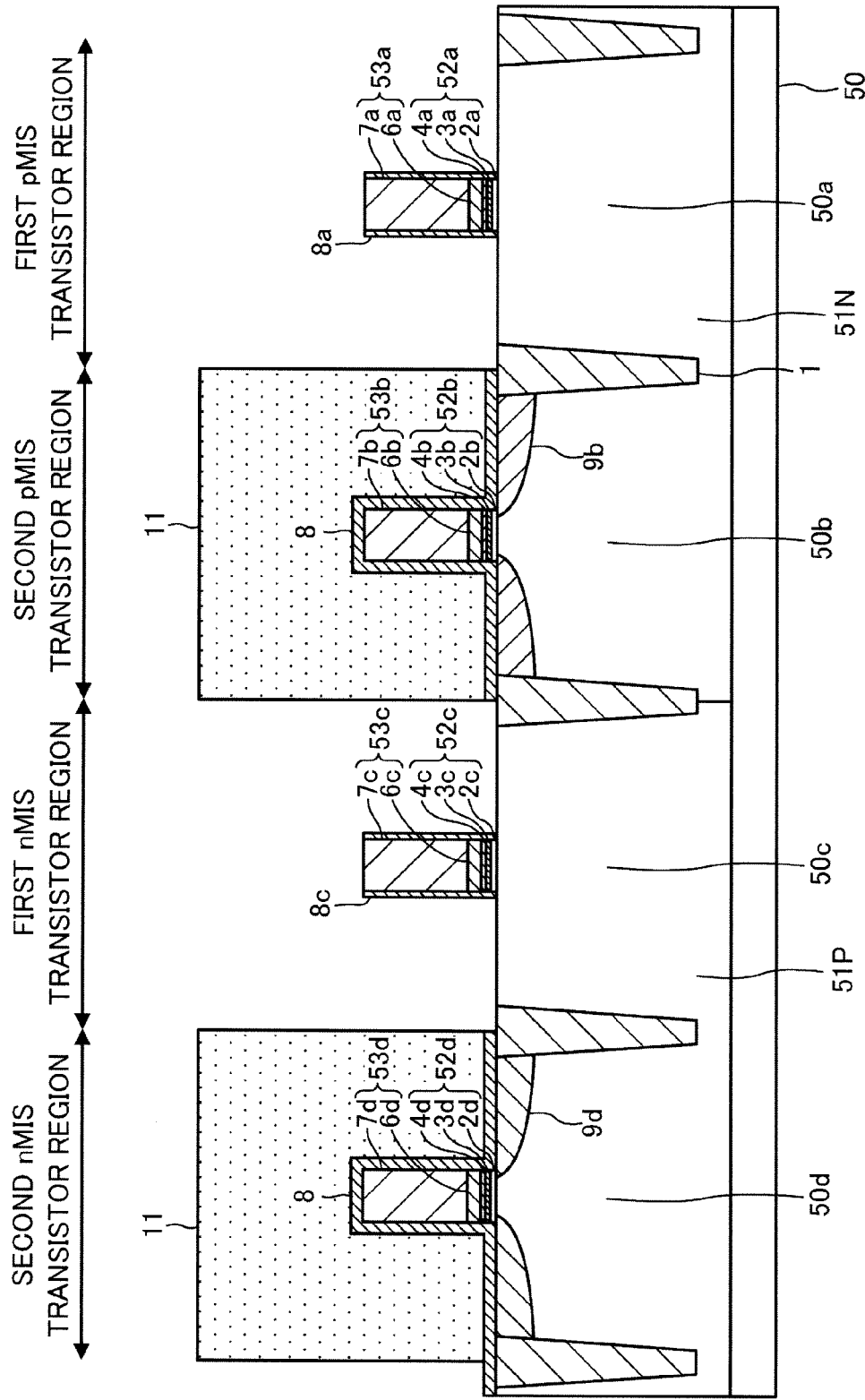
FIG. 5 is a cross-sectional view (taken along a gate length direction) illustrating a step of the method for fabricating the semiconductor device according to the embodiment of the present disclosure.

As shown in FIG. 5, after forming a resist pattern 11 covering the second pMIS transistor region and the second nMIS transistor region by photolithography, the insulting film 8 is subjected to dry etching with the resist pattern 11 used as a mask. This dry etching forms offset spacers 8a each having an I-shaped cross-section on the side surfaces of the gate electrode 53a located in the first pMIS transistor region, and offset spacers 8c each having an I-shaped cross-section on the side surfaces of the gate electrode 53c located in the first nMIS transistor region. In this step, each of the offset spacers 8a and 8c has a thickness of about 2.5 nm, which is smaller than the original thickness (e.g., about 6 nm) of the insulating film 8.

Figure 6:
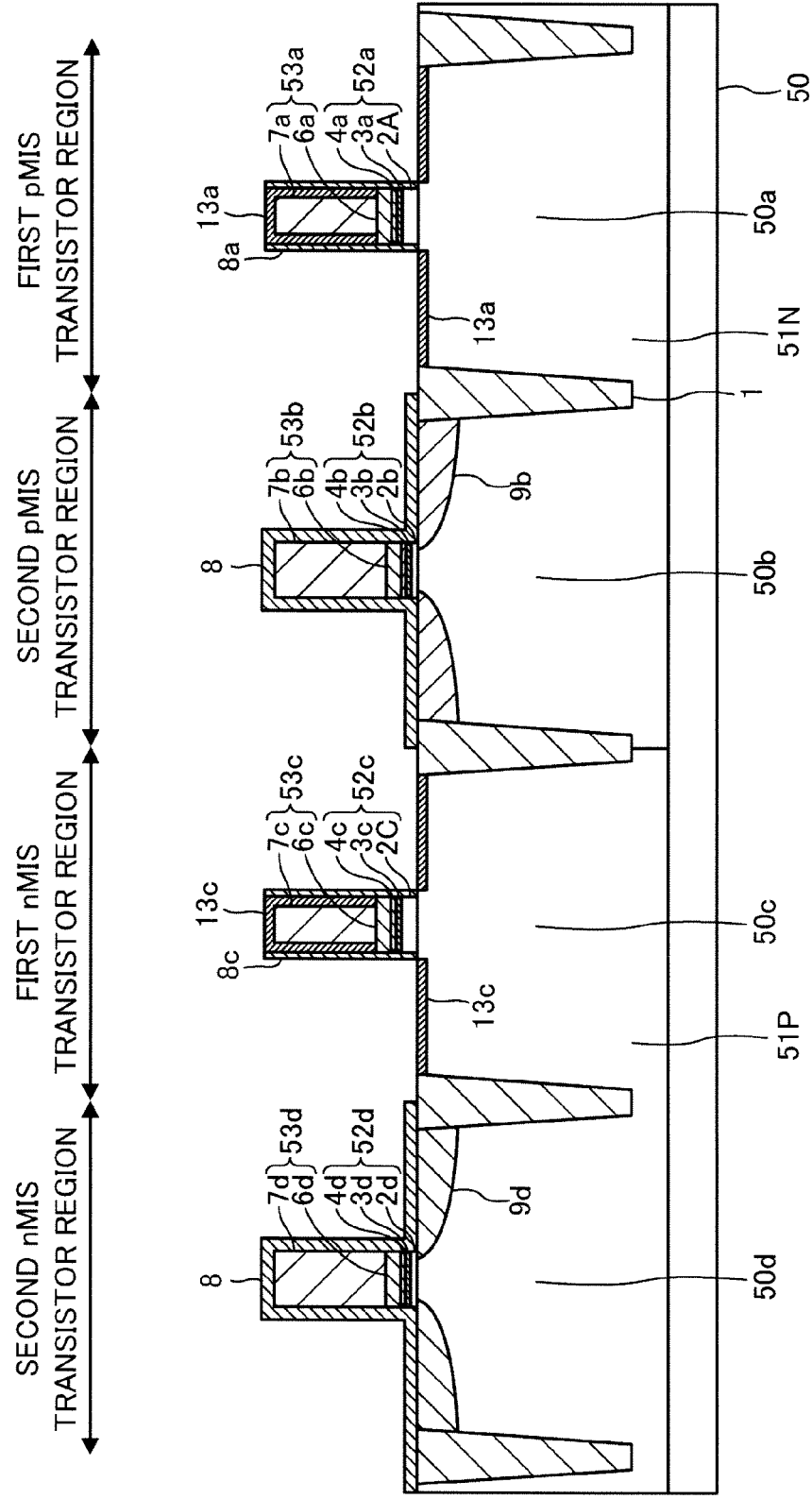
FIG. 6 is a cross-sectional view (taken along a gate length direction) illustrating a step of the method for fabricating the semiconductor device according to the embodiment of the present disclosure.

After removing the resist pattern 11, the semiconductor substrate 50 is subjected to an oxidation treatment in, for example, plasma composed of a gas containing oxygen and at, for example, about 400° C. Consequently, as shown in FIG. 6, the thickness of the interface layer 2a of the gate insulating film 52a in the first pMIS transistor region increases, from both sides thereof, by about 0.3 nm, and the thickness of the interface layer 2c of the gate insulating film 52c in the first nMIS transistor region increases, from both sides thereof, by about 0.3 nm. These interface layers with the increased thickness are denoted by reference characters 2A and 2C, respectively. Even after the thick interface layers 2A and 2C are formed, the thicknesses of the high-k films 3a and 3c remain substantially unchanged. Thus, each of the high-k films 3a, 3b, 3c, and 3d continues to have substantially the same thickness after the thick interface layers 2A and 2C are formed.

Further, in the step shown in FIG. 6, a silicon dioxide film 13a with a thickness of about 0.3 nm is formed on the upper surface and the side surfaces of the silicon film 7a of the gate electrode 53a located in the first pMIS transistor region. A silicon dioxide film 13c with a thickness of about 0.3 nm is also formed on the upper surface and the side surfaces of the silicon film 7c of the gate electrode 53c located in the first nMIS transistor region. Specifically, the resultant silicon dioxide film 13a is interposed between the silicon film 7a of the gate electrode 53a located in the first pMIS transistor region and the offset spacers 8a, and the resultant silicon dioxide film 13c is interposed between the silicon film 7c of the gate electrode 53c located in the first nMIS transistor region and the offset spacers 8c. In addition, a silicon dioxide film 13a with a thickness of about 0.3 nm is also formed on the surfaces of portions of the active region 50a located at both sides of the gate electrode 53a, and a silicon dioxide film 13c with a thickness of about 0.3 nm is also formed on the surfaces of portions of the active region 50c located at both sides of the gate electrode 53c.

The interface layer 2a of the gate insulating film 52a and side portions of the silicon film 7a of the gate electrode 53a are oxidized by oxygen having passed through the offset spacers 8a, and the interface layer 2c of the gate insulating film 52c and side portions of the silicon film 7c of the gate electrode 53c are oxidized by oxygen having passed through the offset spacers 8c.

On the other hand, in the step shown in FIG. 6, since the gate structures of the second pMIS transistor region and the second nMIS transistor region are covered by the insulating film 8 having a thickness of about 6 nm, the interface layer 2b of the gate insulating film 52b located in the second pMIS transistor region and the interface layer 2d of the gate insulating film 52d located in the second nMIS transistor region do not increase in thickness.

The interface layers 2a and 2c are oxidized through the treatment carried out using plasma in an oxygen-containing atmosphere in this embodiment. Alternatively, a heat treatment at about 600° C. in an oxygen-containing atmosphere may be performed.

Figure 7:
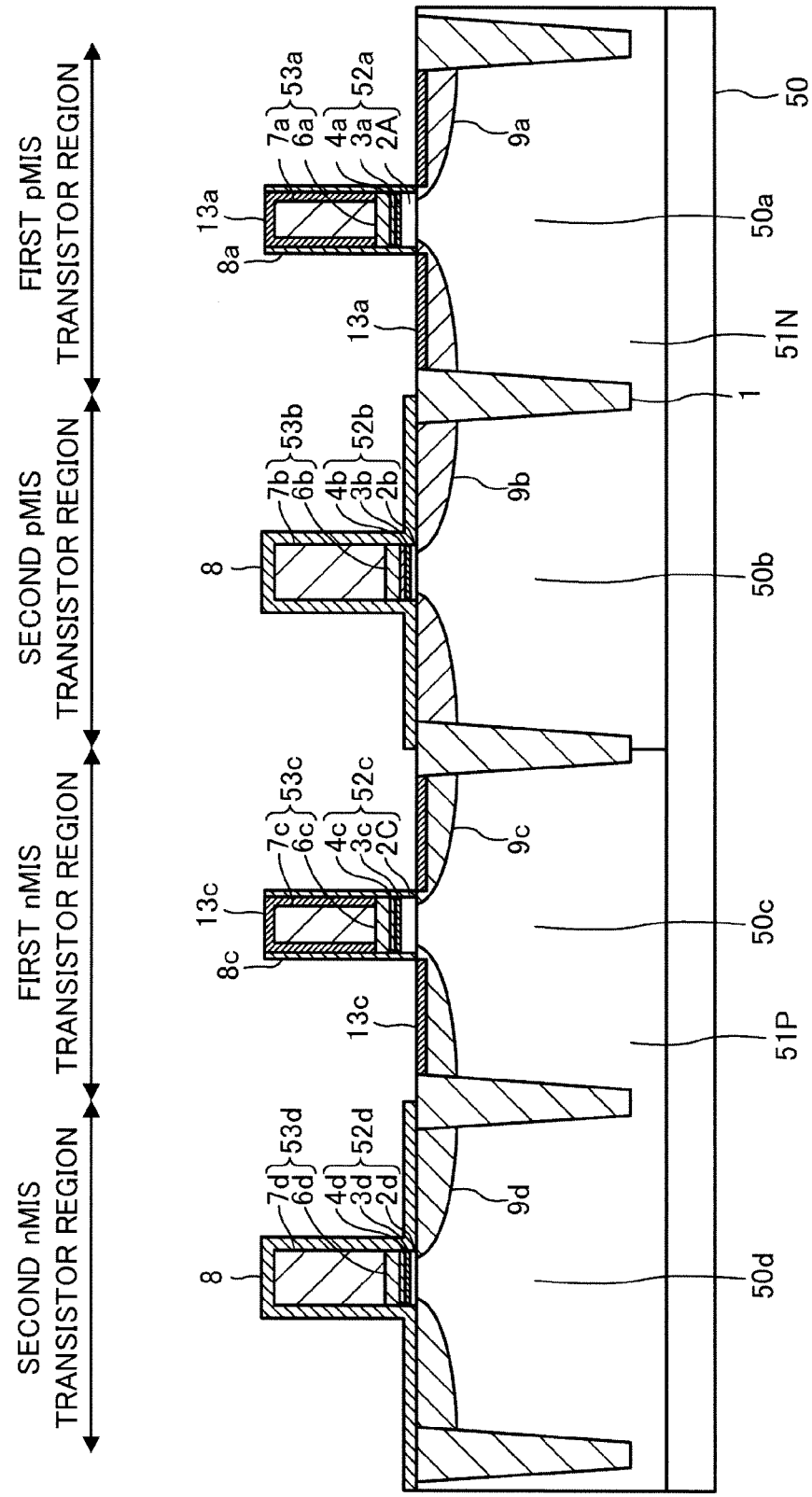
FIG. 7 is a cross-sectional view (taken along a gate length direction) illustrating a step of the method for fabricating the semiconductor device according to the embodiment of the present disclosure.

Using a resist pattern (not shown) which exposes the first pMIS transistor region, a p-type impurity such as boron is introduced into the semiconductor substrate 50 by means of ion implantation. Consequently, as shown in FIG. 7, p-type extension regions 9a are formed under both sides of the gate electrode 53a in the active region 50a. The resist pattern is removed after formation of the p-type extension regions 9a. Here, concerning conditions of the ion implantation, an implantation energy is 0.8 keV and a dose is $1 \times 10^{15}$ cm$^{-2}$, for example. Ge and C may be implanted in the first pMIS transistor region of the semiconductor substrate 50 before the ion implantation of the p-type impurity such as boron. In such a case, Ge may be implanted, for example, at an implantation energy of 5 keV and a dose of $5 \times 10^{14}$ cm$^{-2}$, and C may be implanted, for example, at an implantation energy of 2 keV and a dose of $5 \times 10^{14}$ cm$^{-2}$.

Next, using a resist pattern (not shown) which exposes the first nMIS transistor region, an n-type impurity such as arsenic is introduced into the semiconductor substrate 50 by means of ion implantation. Consequently, n-type extension regions 9c are formed under both sides of the gate electrode 53c in the active region 50c. The resist pattern is removed after formation of the n-type extension regions 9c. Here, concerning conditions of the ion implantation, an implantation energy is 1.2 keV and a dose is $1 \times 10^{15}$ cm$^{-2}$, for example. Ge and C may be implanted in the first nMIS transistor region of the semiconductor substrate 50 before the ion implantation of the n-type impurity such as arsenic. In such a case, Ge may be implanted, for example, at an implantation energy of 5 keV and a dose of $5 \times 10^{14}$ cm$^{-2}$, and C may be implanted, for example, at an implantation energy of 2 keV and a dose of $5 \times 10^{14}$ cm$^{-2}$.

Figure 8:
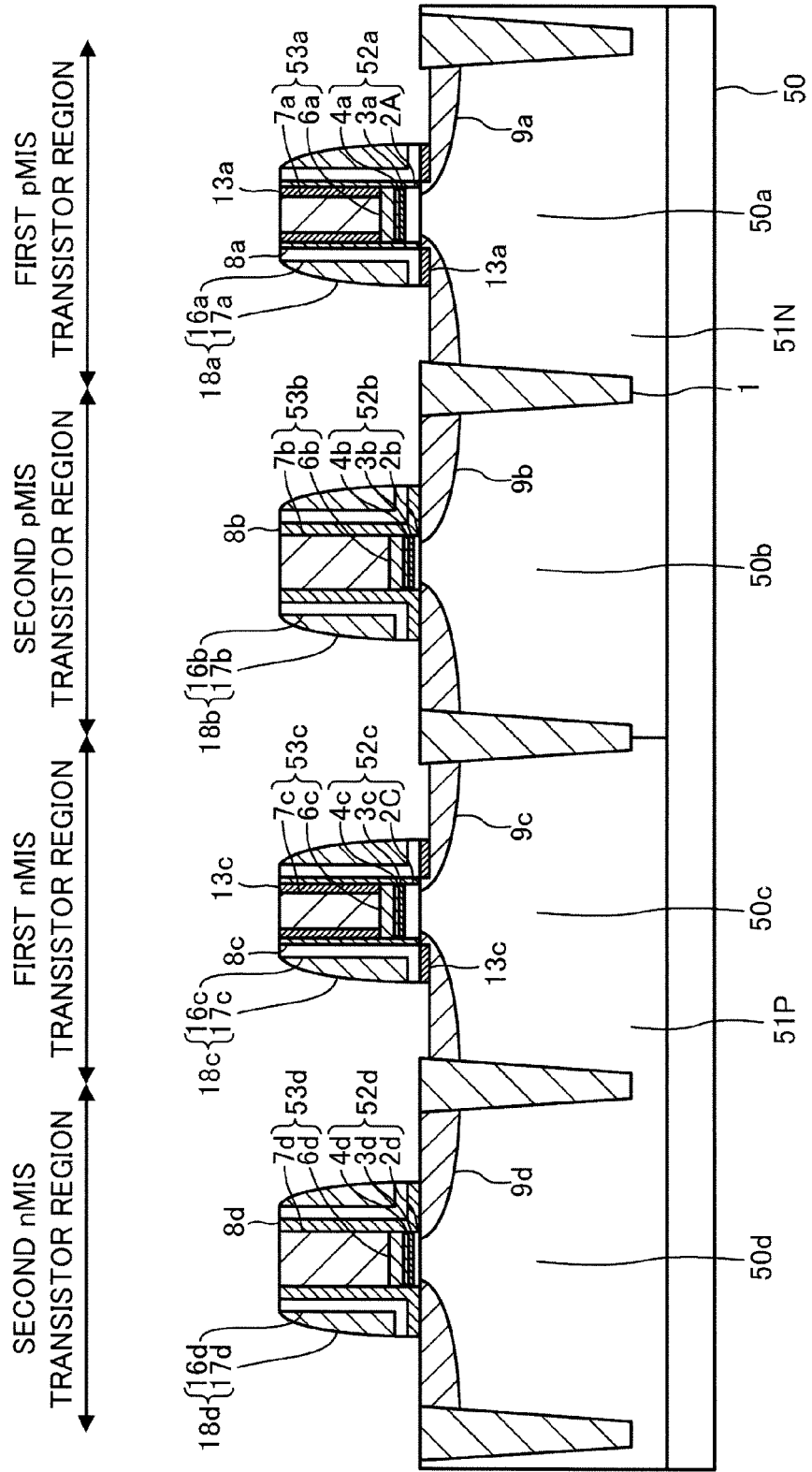
FIG. 8 is a cross-sectional view (taken along a gate length direction) illustrating a step of the method for fabricating the semiconductor device according to the embodiment of the present disclosure.

A silicon dioxide film and a silicon nitride film are sequentially deposited on the entire surface of the semiconductor substrate 50, and then, the deposited silicon nitride film and the deposited silicon dioxide film are etched back. Consequently, as shown in FIG. 8, sidewall spacers 18a, 18b, 18c, and 18d are formed on both sides of the gate electrodes 53a, 53b, 53c, and 53d, respectively. Each of the sidewall spacers 18a includes an inner sidewall spacer 16a of a silicon dioxide film with an L-shaped cross section and an outer sidewall spacer 17a of a silicon nitride film formed on the inner sidewall spacer 16a. Each of the sidewall spacers 18b includes an inner sidewall spacer 16b of a silicon dioxide film with an L-shaped cross section and an outer sidewall spacer 17b of a silicon nitride film formed on the inner sidewall spacer 16b. Each of the sidewall spacers 18c includes an inner sidewall spacer 16c of a silicon dioxide film with an L-shaped cross section and an outer sidewall spacer 17c of a silicon nitride film formed on the inner sidewall spacer 16c. Each of the sidewall spacers 18d includes an inner sidewall spacer 16d of a silicon dioxide film with an L-shaped cross section and an outer sidewall spacer 17d of a silicon nitride film formed on the inner sidewall spacer 16a In the step shown in FIG. 8, the insulating film 8 remaining in the second pMIS transistor region and the second nMIS transistor region is also etched back. Consequently, an underlying spacer 8b with an L-shaped cross section is formed between the gate electrode 53b and an associated one of the sidewall spacers 18b (the inner sidewall spacers 16b). At the same time, an underlying spacer 8d with an L-shaped cross section is formed between the gate electrode 53d and an associated one of the sidewall spacers 18d (the inner sidewall spacers 16d). The underlying spacers 8b are in contact with the silicon film 7b of the gate electrode 53b. The underlying spacers 8d are in contact with the silicon film 7d of the gate electrode 53d. The thicknesses of the underlying spacers 8b and 8d are approximately the same as the original thickness (e.g., about 6 nm) of the insulating film 8, and larger than the thicknesses (e.g., about 2.5 nm) of the offset spacers 8a and 8.

In the step shown in FIG. 8, the silicon dioxide film 13a present on the upper face of the gate electrode 53a and on the active region 50a and the silicon dioxide film 13c present on the upper face of the gate electrode 53c and on the active region 50c are also etched back. Consequently, the offset spacers 8a and the remaining silicon dioxide film 13a are interposed between the side surfaces of the gate electrode 53a and the sidewall spacers 18a, and the remaining silicon dioxide film 13a is also interposed between the active region 50a (the p-type extension regions 9a) and the sidewall spacers 18a. The offset spacers 8c and the remaining silicon dioxide film 13c are interposed between the side surfaces of the gate electrode 53c and the sidewall spacers 18c, and the remaining silicon dioxide film 13c is also interposed between the active region 50c (p-type extension regions 9c) and the sidewall spacers 18c.

Figure 9:
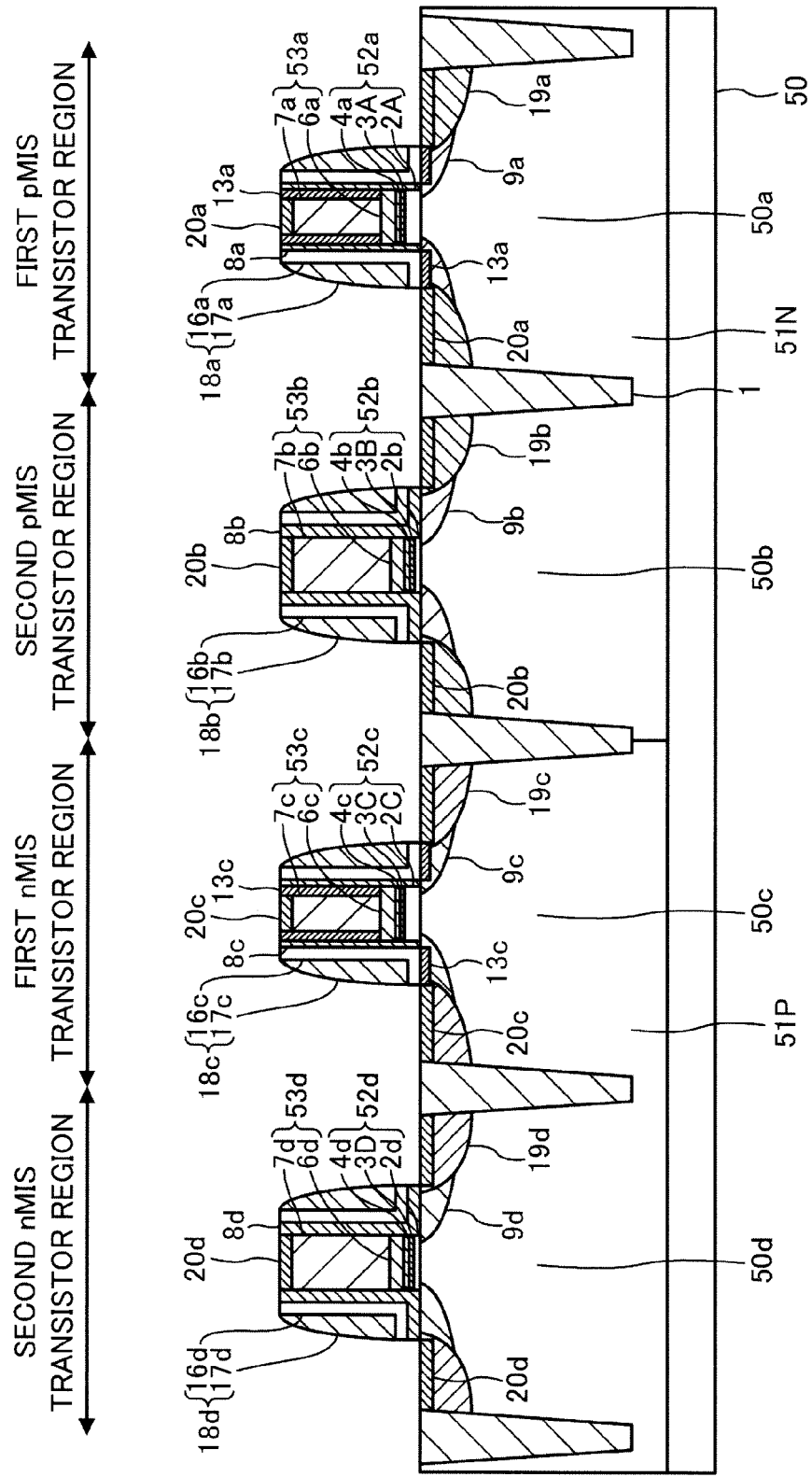
FIG. 9 is a cross-sectional view (taken along a gate length direction) illustrating a step of the method for fabricating the semiconductor device according to the embodiment of the present disclosure.

Using a resist pattern (not shown) which exposes the first and second pMIS transistor regions, a p-type impurity such as boron is introduced into the semiconductor substrate 50 by means of ion implantation. Consequently, as shown in FIG. 9, p-type source/drain regions 19a are formed under the outer sides of the sidewall spacers 18a in the active region 50a, and p-type source/drain regions 19b are formed under the outer sides of the sidewall spacers 18b in the active region 50b. The resist pattern is removed after formation of the p-type source/drain regions 19a and 19b. Here, concerning conditions of the ion implantation, an implantation energy is 1.6 keV and a dose is $1 \times 10^{15}$ cm$^{-2}$, for example. Ge may be implanted in the first and second pMIS transistor regions of the semiconductor substrate 50 before the ion implantation of the p-type impurity such as boron. In such a case, Ge may be implanted, for example, at an implantation energy of 10 keV and a dose of $5 \times 10^{15}$ cm$^{-2}$.

Next, using a resist pattern (not shown) which exposes the first and second nMIS transistor regions, an n-type impurity such as arsenic is introduced into the semiconductor substrate 50 by means of ion implantation. Consequently, n-type source/drain regions 19c are formed under the outer sides of the sidewall spacers 18c in the active region 50c, and n-type source/drain regions 19d are formed under the outer sides of the sidewall spacers 18d in the active region 50d. The resist pattern is removed after formation of the n-type source/drain regions 19c and 19d. Here, concerning conditions of the ion implantation, an implantation energy is 10 keV and a dose is $1 \times 10^{15}$ cm$^{-2}$, for example.

Thereafter, annealing is performed at about 1000° C., thereby activating the impurities which have been introduced by means of ion implantation. In this step, Al contained in the pMIS cap films 4a and 4b diffuses into the high-k films 3a and 3b. These Al-containing high-k films are denoted by reference characters 3A and 3C, respectively. At the same time, La contained in the nMIS cap films 4c and 4d diffuses into the high-k films 3c and 3d. These La-containing high-k films are denoted by reference characters 3C and 3D, respectively.

After a metal film of, for example, Ni is deposited on the entire surface of the semiconductor substrate 50, annealing is performed at about, for example, 260° C. The surface portions of the silicon films 7a, 7b, 7c, and 7c of the gate electrodes 53a, 53b, 53c, and 53d, the surface portions of the p-type source/drain regions 19a and 19b, and the surface portions of the n-type source/drain regions 19c and 19d are caused to react with the deposited metal film to form metal silicide layers 20a, 20b, 20c, and 20d. Thereafter, unreacted portions of the metal film are removed. A CMIS structure is formed through the above steps.

Figure 10:
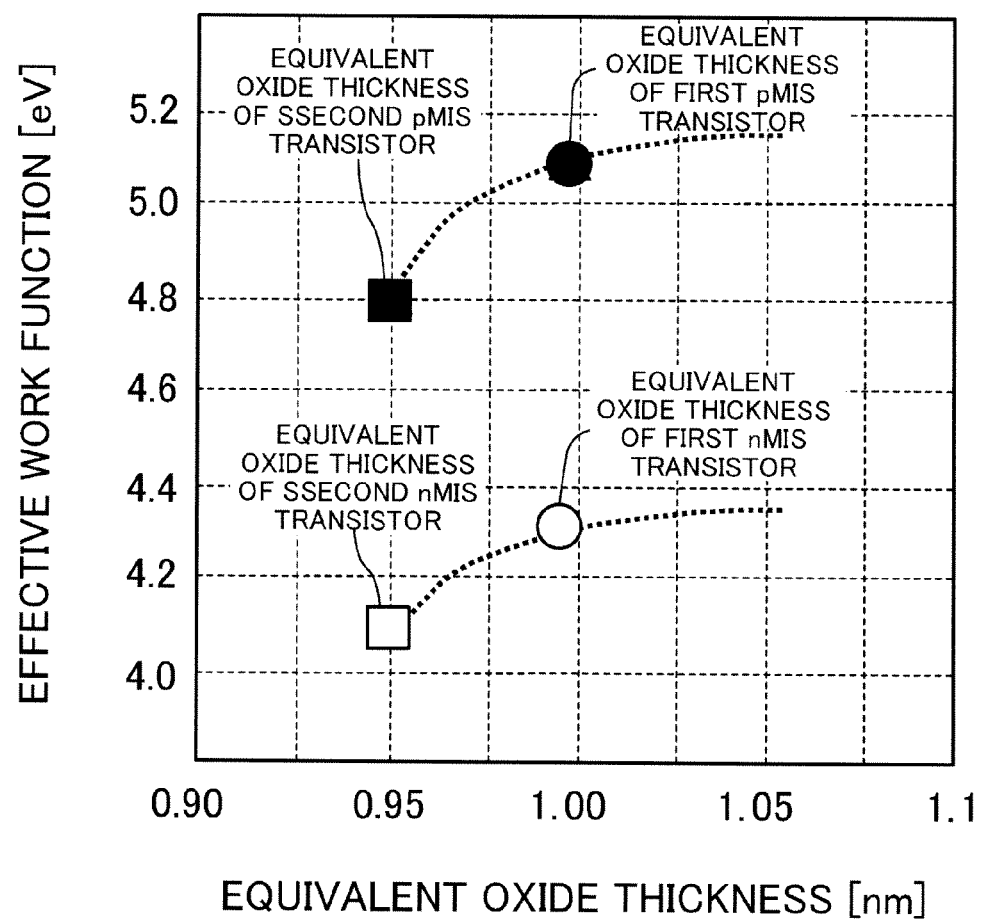
FIG. 10 is a graph showing a relationship between an equivalent oxide thickness (EOT) and a transistor effective work function of a semiconductor device of an embodiment.
Figure 11:
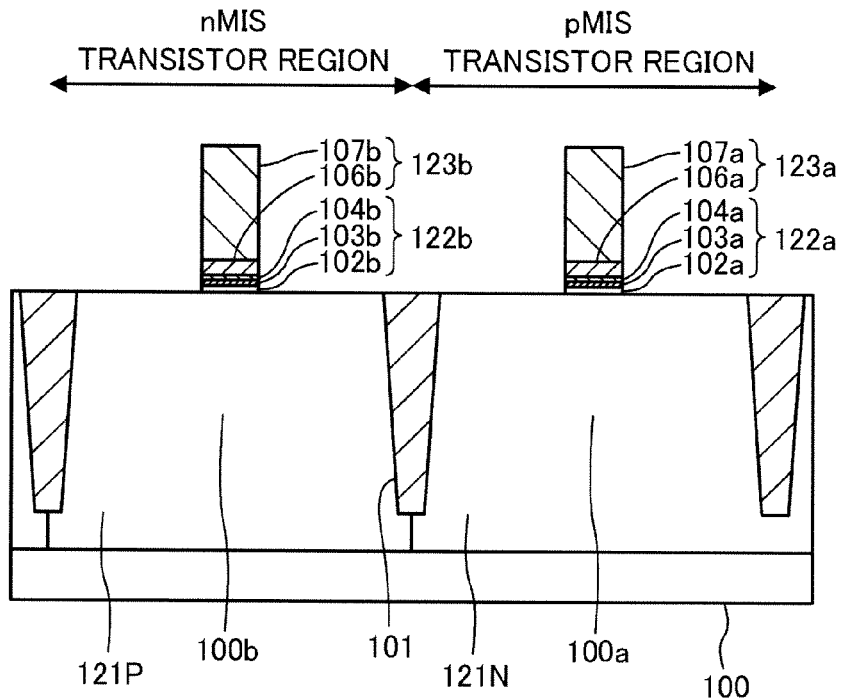
FIG. 11 shows a cross-sectional view (taken along a gate length direction) illustrating a steps of a method for fabricating a conventional semiconductor device.
Figure 12:
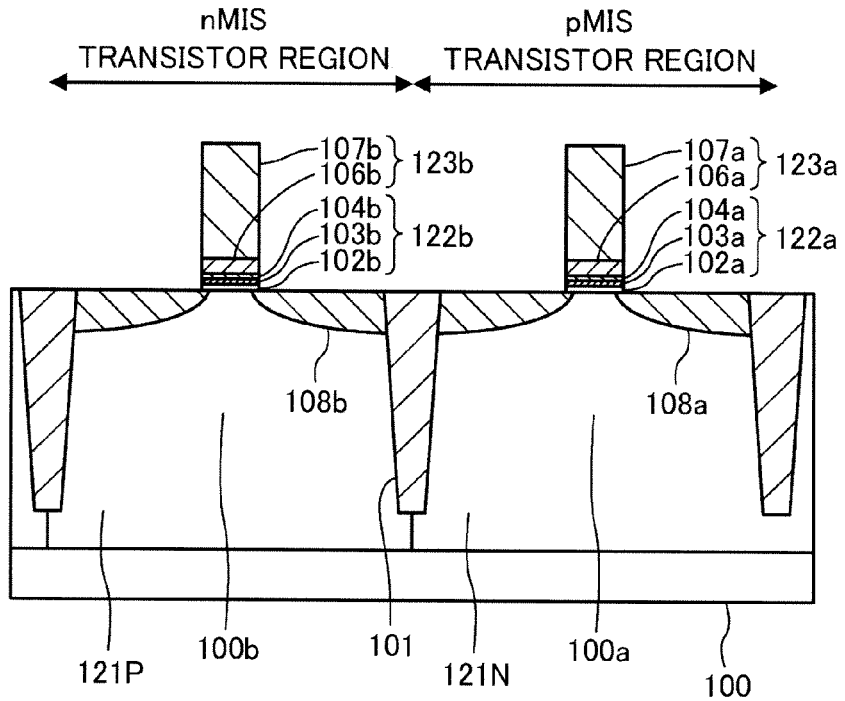
FIG. 12 shows a cross-sectional view (taken along a gate length direction) illustrating a steps of the method for fabricating the conventional semiconductor device.
Figure 13:
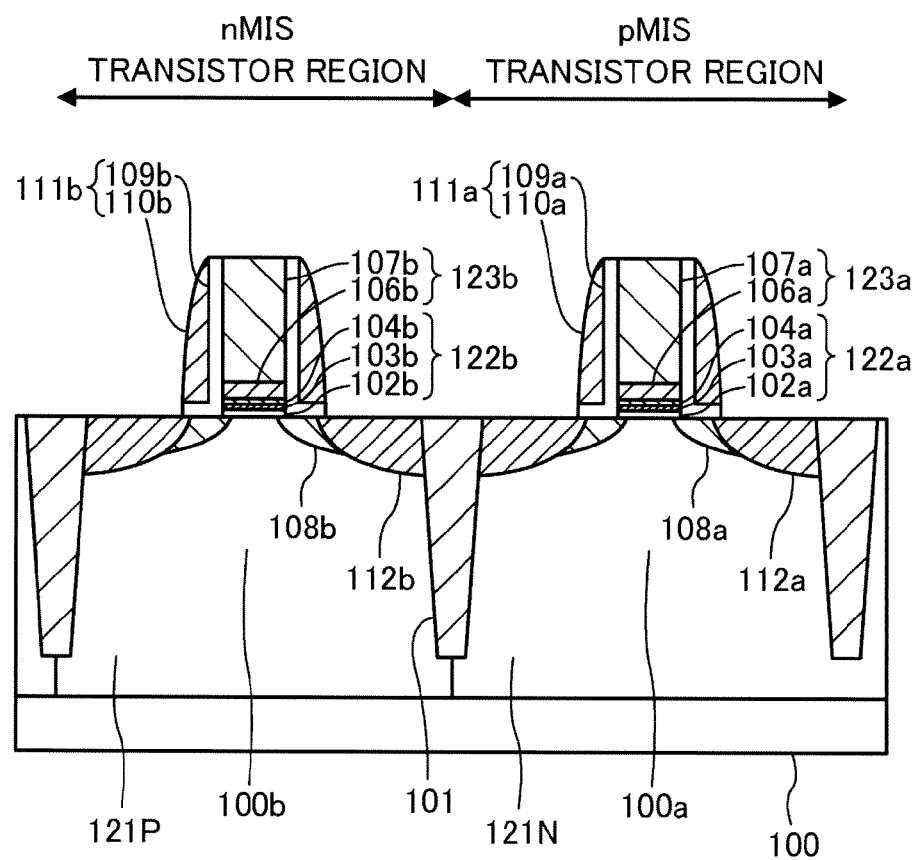
FIG. 13 shows a cross-sectional view (taken along a gate length direction) illustrating a steps of the method for fabricating the conventional semiconductor device.
Figure 14:
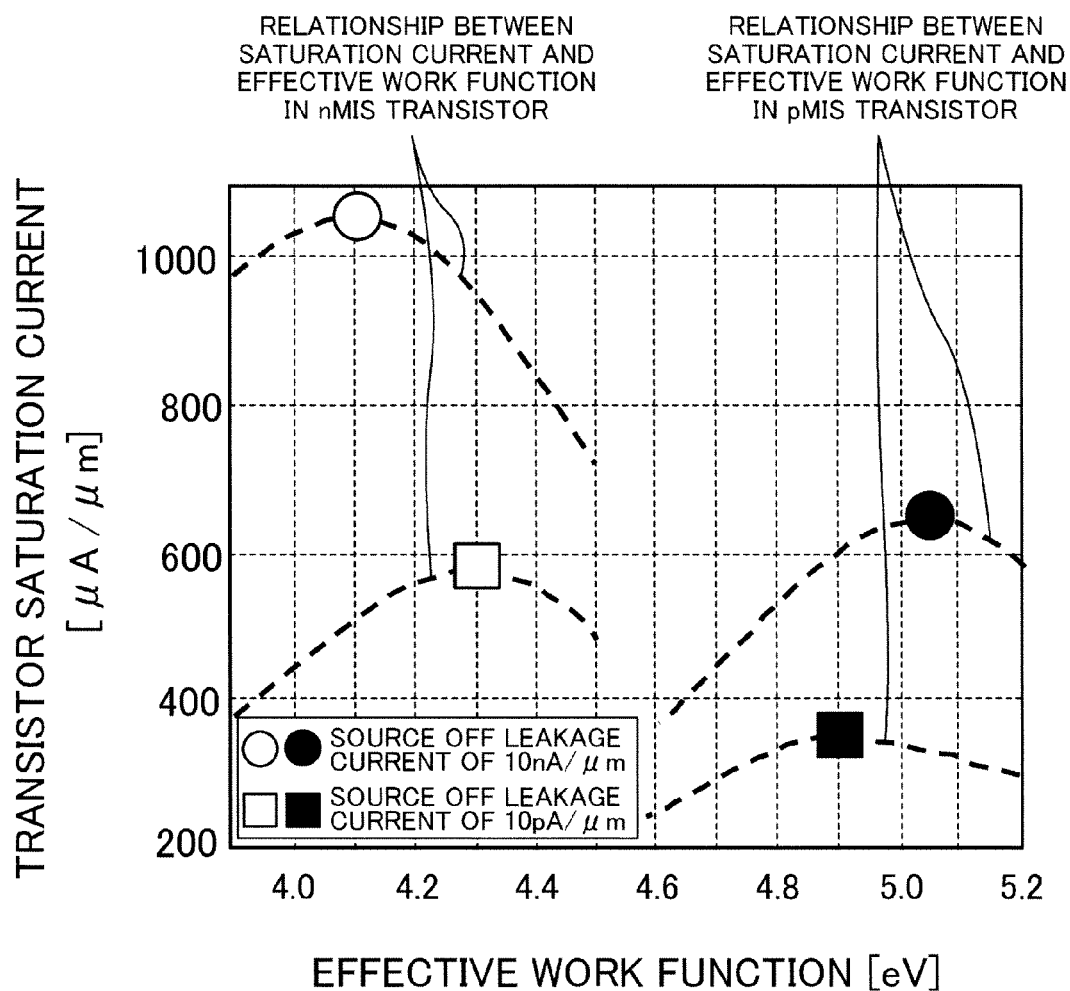
FIG. 14 is a graph showing a relationship between an effective work function and a saturation current of a transistor in which a channel dose is changed whereas a source off leakage current is kept constant.

FIG. 10 shows the relationship between an equivalent oxide thickness (EOT) and an effective work function of each of the transistors of this embodiment. As shown in FIG. 10, the first pMIS transistor and the first nMIS transistor, because of the thick interface layers 2A and 2C, show an increase in equivalent oxide thickness and an increase in effective work function, compared to the second pMIS transistor and the second nMIS transistor. Reason for the increases in equivalent oxide thickness and effective work function will be discussed below.

For example, a heat treatment performed in a step causes oxygen contained in a high-k film including, for example, $HfO_2$ to diffuse and escape from the high-k film. Accordingly, an interface dipole is formed between the high-k film and an interface layer. Formation of the dipole is considered to cause effective work functions to decrease in the both of a pMIS transistor and an nMIS transistor.

On the other hand, as described in the step shown in FIG. 6, in respect of the first pMIS transistor and the first nMIS transistor, the gate electrodes 53a and 53c are exposed to an oxidation atmosphere with both sides surfaces covered with the thin offset spacers 8a and 8c. Accordingly, the interface layers 2a and 2c increase in thickness to be denoted by reference characters 2A and 2C. The interface layers 2A and 2C containing sufficient oxygen supply a sufficient amount of oxygen to the high-k films 3a and 3c (in which the metal have not yet diffused from the cap films), thereby reducing detachment of oxygen from the high-k films 3a and 3c. As a result, the dipole is unlikely to be formed, and the effective work function of each of the first pMIS transistor and the first nMIS transistor can be set high.

In the first nMIS transistor with a high effective work function, a source off leakage current is reduced since a threshold voltage (Vth) increases. Thus, the first nMIS transistor can be used for reducing a leakage current. In the first pMIS transistor with a high effective work function, a driving force increases since a threshold voltage (Vth) decreases. Thus, the first pMIS transistor can be used for increasing the driving force.

As described above, in this embodiment, the interface layer 2a included in the gate insulating film 52a of the first pMIS transistor and the interface layer 2c included in the gate insulating film 52c of the first nMIS transistor are selectively increased in thickness. Accordingly, the EOT of the gate insulating film 52a of the first pMIS transistor and that of the gate insulating film 52c of the first nMIS transistor increase, thereby causing the effective work functions of the first pMIS transistor and the first nMIS transistor to increase. As a result, a plurality of MIS transistors of the same conductivity type and different from each other in work function can be provided in a semiconductor device with a MIS structure in which a high-k film is used as a gate insulating film. In an integrated circuit which is thus allowed to include a plurality of MIS transistors having different work functions, a driving force can be maximized in each of the low-Vth MIS transistors and the high-Vth transistors, thereby enabling the integrated circuit to operate at a high speed with a low leakage current.

In this embodiment, a silicon dioxide film is formed as the interface layer 2a (2A), 2b, 2c (2C), and 2d. Alternatively, a silicon oxynitride film may be formed.

In this embodiment, the pMIS cap films 4a and 4b and the nMIS cap films 4c and 4d are allowed to remain in the final structure of the semiconductor device. However, the Al-containing high-k films 3A and 3B and the La-containing high-k films 3C and 3D are essential for the final structure, and it is not always necessary to allow the pMIS cap films 4a and 4b and the nMIS cap films 4c and 4d to remain in the final structure. For example, if an Al-containing film and a La-containing film are formed before formation of the metal-containing film 6 in the step shown in FIG. 1, the pMIS cap film 4 and the nMIS cap film 4' do not need to remain when the metal-containing film 6 is formed.

In this embodiment, a cap film containing La is used as the nMIS cap film 4'. Alternatively, a cap film containing, for example, dysprosium (Dy), scandium (Sc), or gadolinium (Gd) may be used.

The MIS transistors of this embodiment have substantially the same gate structure (except for the thicknesses of the interface layers). Alternatively, the MIS transistors may have cap films with different thicknesses or gate electrodes made of different materials, for example.

What is claimed is:

1. A semiconductor device comprising:
a first MIS transistor and a second MIS transistor of an identical conductivity type provided on an identical semiconductor substrate,
wherein the first MIS transistor includes a first gate insulating film formed on a first active region in the semiconductor substrate and a first gate electrode formed on the first gate insulating film,
the second MIS transistor includes a second gate insulating film formed on a second active region in the semiconductor substrate and a second gate electrode formed on the second gate insulating film,
the first gate insulating film includes a first interface layer being in contact with the semiconductor substrate and a first high dielectric constant insulating film formed on the first interface layer,
the second gate insulating film includes a second interface layer being in contact with the semiconductor substrate and a second high dielectric constant insulating film formed on the second interface layer,
the first interface layer has a thickness larger than that of the second interface layer, and
each of the first interface layer and the second interface layer is made of a silicon dioxide film or a silicon oxynitride film.

2. The semiconductor device of claim 1, wherein
the first gate electrode includes first sidewall spacers formed on side surfaces thereof and first insulating spacers interposed between the first gate electrode and the first sidewall spacers,
the second gate electrode includes second sidewall spacers formed on side surfaces thereof and second insulating spacers interposed between the second gate electrode and the second sidewall spacers, and
the first insulating spacers are thinner than the second insulating spacers.

3. The semiconductor device of claim 2,
the first insulting spacers are offset spacers each having an I-shaped cross section, and
the second insulating spacers are underlying spacers each having an L-shaped cross section.

4. The semiconductor device of claim 2, wherein
the first gate electrode includes a first metal-containing film formed on the first high dielectric constant insulating film and a first silicon film formed on the first metal-containing film,
the second gate electrode includes a second metal-containing film formed on the second high dielectric constant insulating film and a second silicon film formed on the second metal-containing film,
a silicon dioxide film is interposed between the first silicon film and the first insulating spacers, and
the second silicon film is in contact with the second insulating spacers.

5. The semiconductor device of claim 4, wherein
a first metal silicide layer is formed on the first silicon film, and
a second metal silicide layer is formed on the second silicon film.

6. The semiconductor device of claim 4, wherein a silicon dioxide film is also interposed between the first active region and the first sidewall spacers.

7. The semiconductor device of claim 2, wherein each of the first insulating spacers and the second insulating spacers is made of a silicon nitride film.

8. The semiconductor device of claim 1, wherein
the first and second MIS transistors are pMIS transistors, and
the first and second high dielectric constant insulating films contain aluminum.

9. The semiconductor device of claim 8, wherein
the first gate insulating film further includes a first cap film formed on the first high dielectric constant insulating film and containing aluminum, and
the second gate insulating film further includes a second cap film formed on the second high dielectric constant insulating film and containing aluminum.

10. The semiconductor device of claim 1, wherein
the first and second MIS transistors are nMIS transistors, and
the first and second high dielectric constant insulating films contain lanthanum.

11. The semiconductor device of claim 10, wherein
the first gate insulating film further includes a first cap film formed on the first high dielectric constant insulating film and containing lanthanum, and
the second gate insulating film further includes a second cap film formed on the second high dielectric constant insulating film and containing lanthanum.

12. The semiconductor device of claim 1, wherein each of the first and second high dielectric constant insulating films contains hafnium or zirconium.

13. The semiconductor device of claim 1, wherein the first and second high dielectric constant insulating films are equal in thickness.

14. The semiconductor device of claim 1, wherein the first and second gate electrodes are made of an identical material.

15. The semiconductor device of claim 1, wherein an effective work function of the first MIS transistor is higher than an effective work function of the second MIS transistor.

* * * * *